(12) United States Patent
Basceri et al.

(10) Patent No.: US 6,522,570 B1
(45) Date of Patent: Feb. 18, 2003

(54) SYSTEM AND METHOD FOR INHIBITING IMPRINTING OF CAPACITOR STRUCTURES OF A MEMORY

(75) Inventors: Cem Basceri, Boise, ID (US); Daniel F. Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/022,036

(22) Filed: Dec. 13, 2001

(51) Int. Cl.[7] .................................................. G11C 11/22
(52) U.S. Cl. ..................... 365/145; 365/149; 365/189.01
(58) Field of Search ................................. 365/145, 149, 365/117, 189.01, 189.07, 189.11, 189.12

(56) References Cited

U.S. PATENT DOCUMENTS

| | | | | |
|---|---|---|---|---|
| 5,262,982 A | * | 11/1993 | Brassington et al. | 365/145 |
| 5,663,904 A | * | 9/1997 | Arase | 365/145 |
| 5,852,571 A | | 12/1998 | Kinney | 365/145 |
| 5,905,672 A | | 5/1999 | Seyyedy | 365/145 |
| 5,946,224 A | * | 8/1999 | Nishimura | 365/117 |
| 5,953,245 A | * | 9/1999 | Nishimura | 365/145 |
| 6,121,648 A | | 9/2000 | Evans, Jr. | 257/295 |

* cited by examiner

Primary Examiner—David Lam
(74) Attorney, Agent, or Firm—Dorsey & Whitney LLP

(57) ABSTRACT

A system and method for inhibiting the imprinting of capacitor structures employed by memory cells by occasionally changing charge states of the capacitors to a complementary charge state.

37 Claims, 4 Drawing Sheets

SYSTEM AND METHOD FOR INHIBITING IMPRINTING OF CAPACITOR STRUCTURES OF A MEMORY

TECHNICAL FIELD

The present invention relates generally to the field of computer memories, and more particularly, to memory devices employing memory cells having capacitor structures.

BACKGROUND OF THE INVENTION

One type of non-volatile memory device stores information by altering the direction of polarization of a ferroelectric dielectric layer within the device. The polarization of the dielectric is maintained when power is removed from the system, thus providing non-volatile operation. These devices are structurally similar to capacitors in which the dielectric layer is replaced by a ferroelectric material which can be polarized in one of two directions. The direction of polarization is used to store information, a "1" corresponding to one direction of polarization and a "0" corresponding to the other direction of polarization.

Placing ferroelectric material between the plates of a capacitor on a semiconductor substrate causes the capacitor to exhibit a memory effect in the form of charge polarization between the plates of the capacitor. In effect, when the capacitor is charged with the field lines running in one direction across the capacitor plates, a residual charge polarization remains after the charge is removed from the capacitor plates. If an opposite charge is placed on the capacitor plates, an opposite residual polarization remains. A plot of the applied field voltage (E) across the plates of the capacitor against the polarization (P) of the ferroelectric material between the plates of the capacitor exhibits a hysteresis curve as shown in FIG. 1. This type of hysteresis response of ferroelectric material between the plates of the capacitor manufactured on a semiconductor die is known in the art.

Using ferroelectric material in the manufacture of capacitors for use in the cells of memory arrays is also known in the art. By applying a coercive voltage across the plates of the ferroelectric capacitor to produce one polarization or another, the residual polarization stores a nonvolatile 1 or 0 in the cell. If a ferroelectric capacitor has zero volts applied across its plates, it may be polarized as indicated by either point A or point D in FIG. 1. Assuming that the polarization is at point A, if a positive voltage is applied across the capacitor which is greater than the "coercive voltage" indicated by line B, then the capacitor will conduct current and move to a new polarization at point C. When the voltage across the capacitor returns to zero, the polarization will remain the same and move to point D. If a positive voltage is applied across the capacitor when it is polarized at point D, the capacitor will not conduct current, but will move to point C. It can be seen that a negative potential can be used to change the polarization of a capacitor from point D to point A. Therefore, points A and D can represent two logic states occurring when zero volts are applied to the capacitor and which depend upon the history of voltage applied to the capacitor.

The direction of the polarization may be sensed by applying a potential sufficient to switch the polarization across the capacitor. For example, assume that the applied potential difference is such that it would switch the dielectric to the polarization state corresponding to a "1". If the capacitor was polarized such that it stored a "1" prior to the application of the read potential, the polarization will not be altered by the read voltage. However, if the capacitor was polarized such that it stored a "0" prior to the application of the read potential, the polarization direction will switch. This switching will give rise to a current that flows from one plate of the capacitor to the other. A sense amplifier measures the current that flows in response to the read potential to determine the state of the capacitor. Once the capacitor has been read, the data must be rewritten in the capacitor if the read potential caused the state of the capacitor to switch.

While this type of memory has been known to the art for some time, various problems have limited commercial realizations of this type of memory. One such problem is commonly referred to as "imprinting." Imprinting is the tendency of a ferroelectric capacitor to exhibit a shift of its hysteresis curve along the voltage axis in either the positive or negative direction depending on the data stored therein. It is believed that charge defects, for example oxygen vacancies, in the ferroelectric material tend to electromigrate over a certain period of time and aggregate at the interface of the ferroelectric material and one of the capacitor electrodes, thus causing the hysteresis curve to shift. This tendency can lead to a logic state failure for either of two reasons. First, after a sufficient shift, both logic states appear the same to a sense amplifier. Second, the coercive voltage becomes too large to be switched by the available programming voltage. When either case is encountered, a memory cell based on the capacitor becomes useless.

Some have addressed the imprinting problem by attempting to improve the process of fabricating the ferroelectric memory cells, for example, the process described in U.S. Pat. No. 6,121,648 to Evans, Jr. However, taking this approach generally requires the addition of several steps to existing process flows. Integrating the additional steps often require extensive modification of known processes and introduce additional complexities to already complicated fabrication processes. Moreover, the additional process steps increase the time required to complete fabrication of the memory devices, consequently, reducing fabrication throughput and production efficiency. Therefore, there is a need for an alternative approach that addresses problems, such as imprinting, that are associated with ferroelectric memory cells.

SUMMARY OF THE INVENTION

The present invention is directed to a system and method for inhibiting the imprinting of capacitor structures employed by memory cells. A bias having the appropriate polarity to change the charge state of the capacitors to a complementary charge state is applied to the memory cells of an array. As a result, the charge defects can be maintained within or drawn back toward the bulk of the ferroelectric material of the capacitors.

DETAILED DESCRIPTION OF THE INVENTION

Embodiments of the present invention provide a system and method for inhibiting the imprinting of capacitor structures employed by memory cells. Certain details are set forth below to provide a sufficient understanding of the invention. However, it will be clear to one skilled in the art that the invention may be practiced without these particular details. In other instances, well-known circuits, control signals, timing protocols, and software operations have not been shown in detail in order to avoid unnecessarily obscuring the invention.

Figure 1:
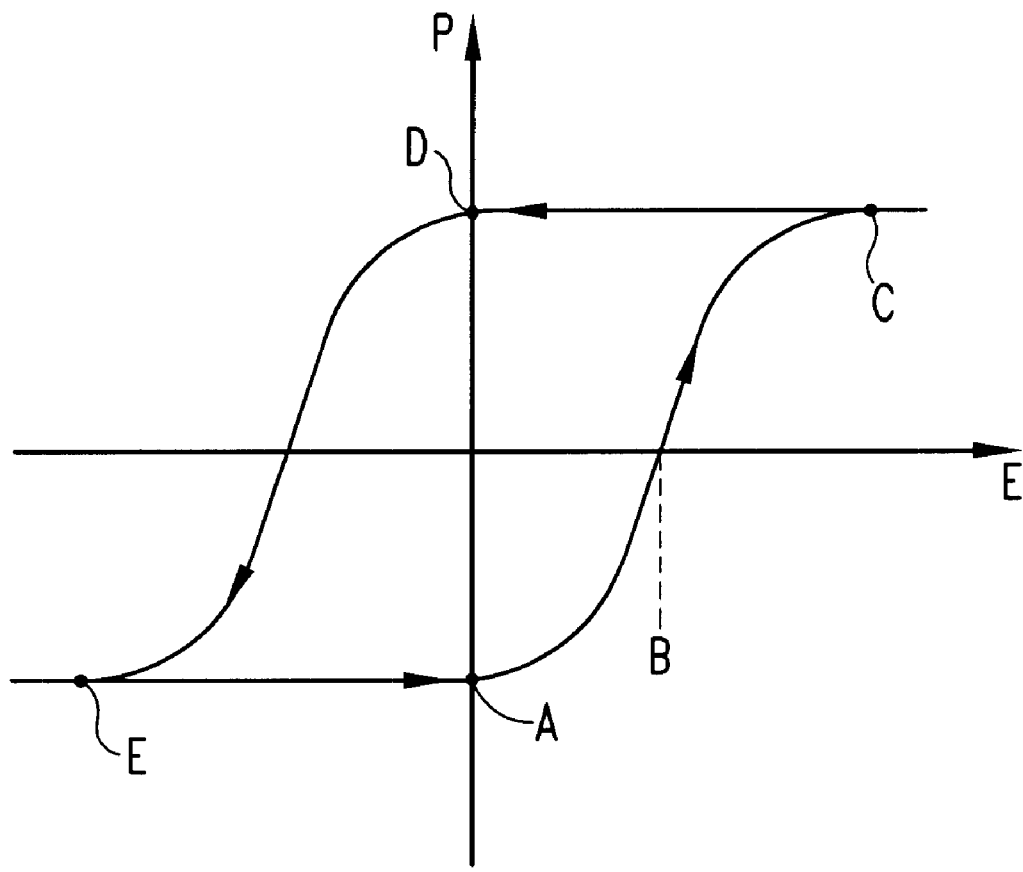
FIG. 1 is a hysteresis curve of a capacitor having a ferroelectric dielectric.
Figure 2:
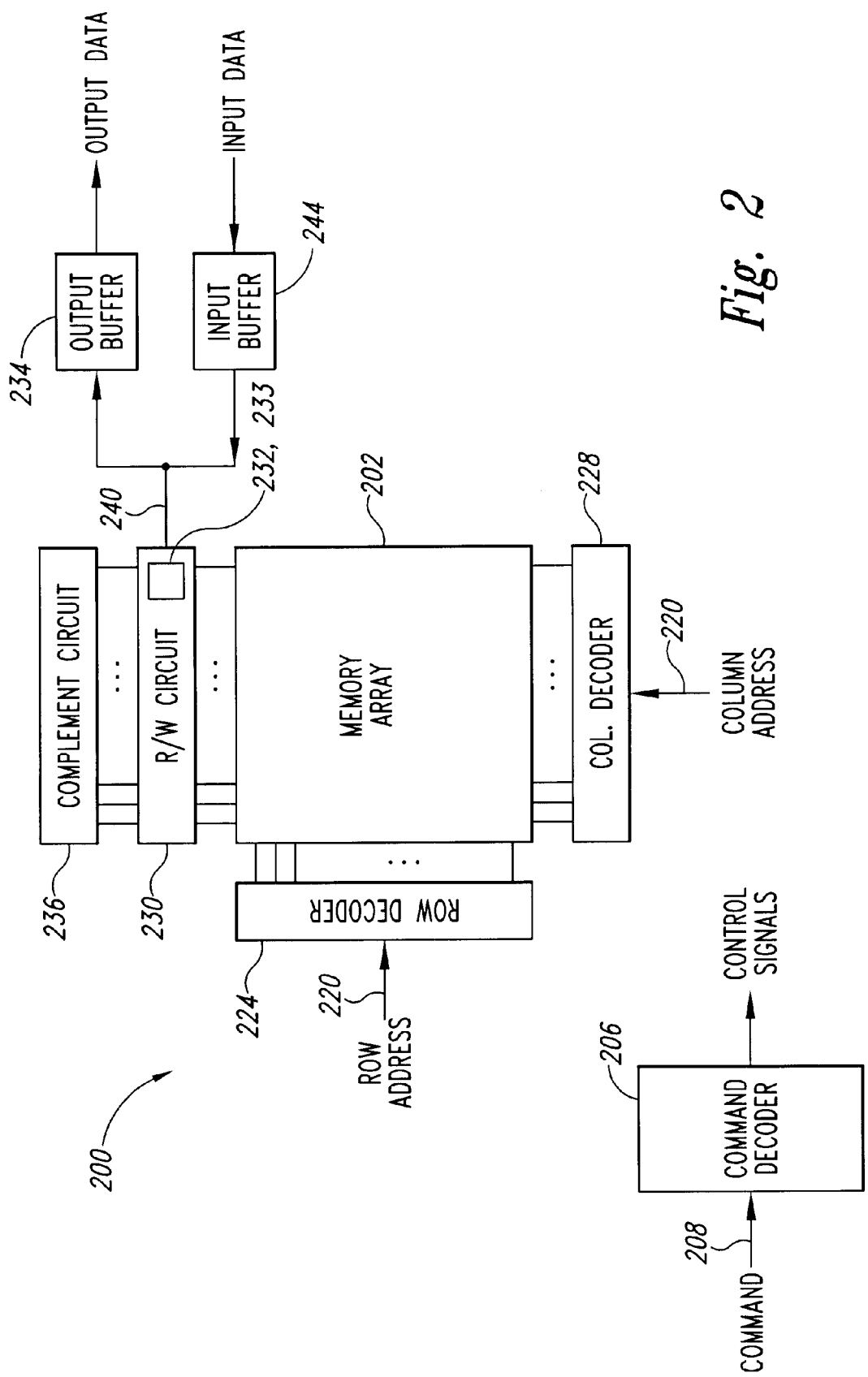
FIG. 2 is a block diagram of a memory device according to an embodiment of the present invention.

FIG. 2 is a memory device 200 according to an embodiment of the present invention. The memory device includes a memory array 202 having ferroelectric memory cells. The memory device 200 includes a command decoder 206 that receives memory commands through a command bus 208 and generates corresponding control signals within the memory device 200 to carry out various memory operations. A row and column address are applied to the memory device 200 through a multiplexed address bus 220 and are decoded by a row address decoder 224 and a column address decoder 228, respectively. Memory array read/write circuitry 230 are coupled to the array 202 to provide read data to a data output buffer 234 via a input-output data bus 240. Write data are applied to the memory array 202 through a data input buffer 244 and the memory array read/write circuitry 230. Included in the read/write circuitry 230 is a register 232 and logic circuitry 233, and coupled to the read/write circuitry 230 is a complementing circuit 236. As will be explained in greater detail below, the complementing circuit 236 interprets the data sensed by the read/write circuitry 230 and provides complementary data to be written back to the sensed memory cells. The register 232 is used to store information corresponding to the "orientation" of the charge states of the memory cells of the memory array 202, and the logic circuitry 233 is used to correct the charge state of data read from and written to the memory array 202 based on the information stored by the register 232.

The command controller 206 responds to memory commands applied to the command bus 208 to perform different operations on the memory array 202. In particular, the command controller 206 is used to generate internal control signals to read data from and write data to the memory array 202. During one of these access operations, an address provided on the address bus 220 is decoded by the row decoder 224 to access one row of the memory array 202. Likewise, input provided on the address bus 220 is decoded by the column decoder 228 to access at least one column of the memory array 202. During a read operation, the data stored in the addressed memory cell or cells are then transferred to the output buffer 234 and provided on the data output lines. In a write operation, the addressed memory cell is accessed and data provided on the data input lines and the data input buffer 244 is stored in the cell.

Figure 3:
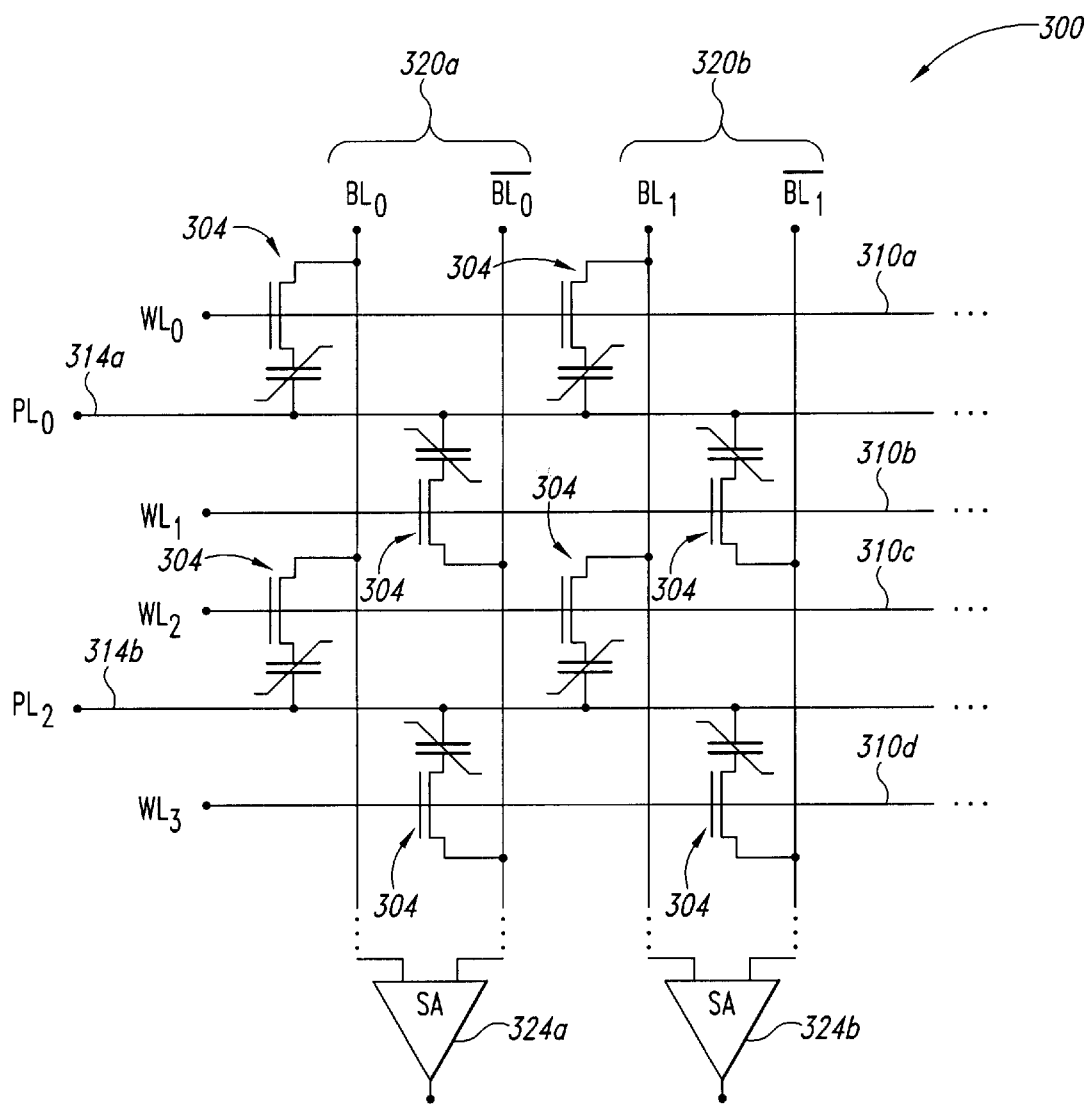
FIG. 3 schematic diagram of a portion of a memory array having ferroelectric memory cells.

FIG. 3 illustrates an memory array 300 having arrangement of ferroelectric memory cells and that can be substituted for the memory array 202 of FIG. 2. The arrangement of FIG. 3 is conventional, and those of ordinary skill in the art are familiar with the operation and design thereof. For example, memory devices including ferroelectric memory cells, and the operation thereof, are provided in U.S. Pat. No. 5,852,571 to Kinney, and U.S. Pat. No. 5,905,672 to Seyyedy, both of which are incorporated herein by reference. However, a short description of its operation has been included herein for the benefit of the reader.

Memory cells 304 each include a ferroelectric capacitor and an access transistor. The memory cells 304 are arranged in a regular array such that word lines 310a–310d and plate lines 314a, 314b are used to access rows of ferroelectric capacitor cells. The memory cells are further arranged along columns 320a, 320b. Each of the columns 320a, 320b include complementary bit lines that are coupled to a respective sense amplifier 324a, 324b. The access transistor acts as a switch that connects the respective ferroelectric capacitor to a respective bit line. This connection is made in response to a signal on the word line 310. The sense amplifier 324 measures the flow of charge into the capacitor and latches the logic state of the memory cell.

Although a brief description of read and write operations of the memory array 300 is provided herein, it will be appreciated that the operations are known by those of ordinary skill in the art. Moreover, the design and particular arrangement of ferroelectric memory cells described herein are exemplary, and are not intended to limit the scope of the present invention. Some or all of the principles of the present invention may be applied to other memory cell having capacitor structures that exhibit the same migration phenomena of charge defects, such as resistance degradation in dielectrics like BST.

Figure 4:
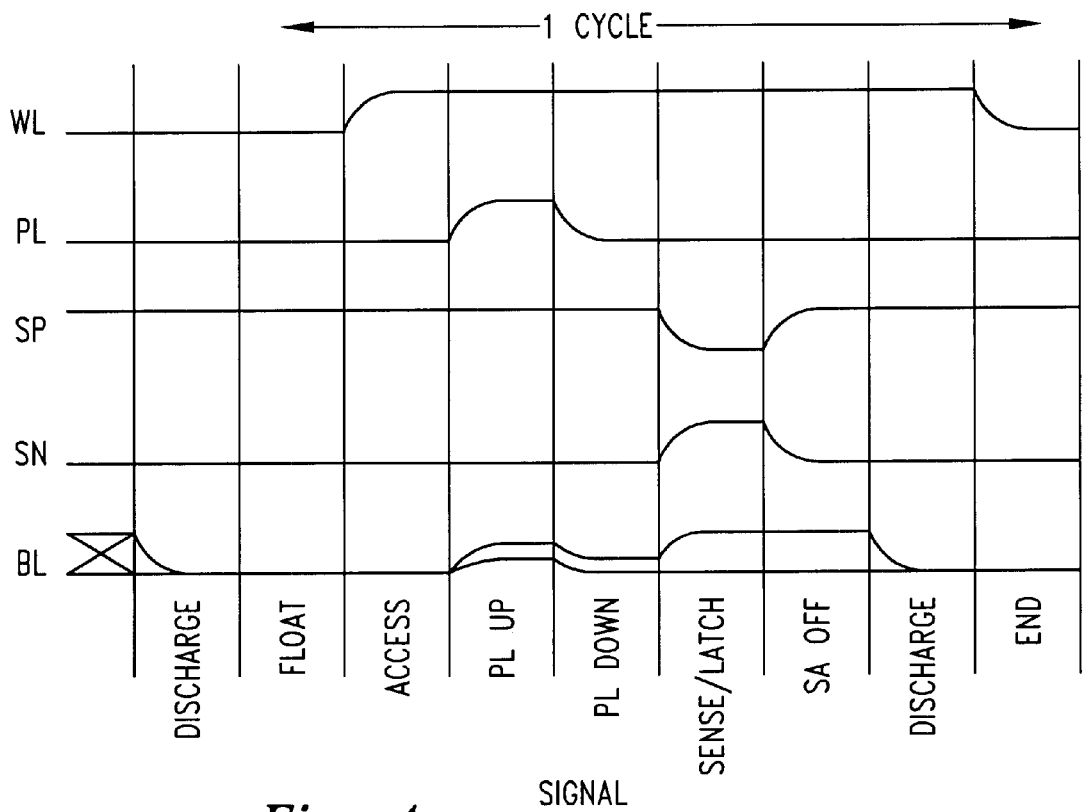
FIG. 4 is a timing diagram of various signals related to accessing a ferroelectric memory cell of the memory array of FIG. 3.

FIG. 4 illustrates various signals involved with reading data from a memory cell 304. To access a memory cell 304, the external address lines 113 (FIG. 2) are decoded to identify which row of the memory array 300 is to be accessed. The corresponding word line 310 is then raised to a high voltage level so that all of the access transistor having their gate connected to that word line 310 are activated. As a result, all of the memory cells 304 associated with that word line 310, are coupled to one of the bit lines of the columns 320. To access the data stored in the memory cell, the plate line 314 associated with the addressed row is pulsed high. As known to one skilled in the art, if the polarization of the ferroelectric dielectric is in one state and the plate line is pulsed high, the current through the memory cell 304 will increase the voltage on the bit line which is coupled thereto. If the polarization of the memory cell 304 is in the opposite state, current through the memory cell 304 is resisted and the voltage of the coupled bit line does not change. The change in the voltage on the bit line can be sensed by the respective sense amplifier 324. The sense amplifiers 324 detect the difference in the voltage on the bit line and a reference voltage coupled to the other bit line, as known to one skilled in the art. The sense amplifiers 324 drive the bit line pairs to the appropriate voltage rail. That is, if the voltage of the bit line is higher than the reference voltage, the bit line is driven to the positive voltage rail. Conversely, if the bit line is lower than the reference voltage, the bit line is driven to ground. It will be recognized that different sense amplifier circuits can be used without departing from the spirit of the present invention.

By reading the memory cell, the state of the polarization may be reversed and thus, the data which was stored on the cell will be reversed. That is, assume that the polarization of the dielectric is such that a logical "one" provides a change in voltage of the digit line. To provide the requisite voltage change on the bit line, the polarization of the dielectric is changed. To read a logical one, therefore, the polarization of the memory cell is changed by reading the cell and will represent a logical "zero" after the cell has been read. However, where the memory cell is storing a zero, there will be no voltage change on the bit line and the memory cell will remain polarized in a zero state. It can be seen that by merely reading a memory cell the data will be lost if the memory cell was storing a one. A write-back operation is performed on the memory cell so that the polarization of the memory cell is returned to its pre-read state.

To execute a write operation, the word line 310 is activated to turn on transistor and couple the ferroelectric capacitor to the respective bit line. The bit line is then set high or low, and then the plate line 314 is pulsed. The direction of polarization of the capacitor is set by the state of bit line. For example, to write a one to the memory cell 304, the bit line coupled to the memory cell must be raised to the positive voltage rail while the plate line 314 is at a low potential. This reverses the polarization of the ferroelectric dielectric which resulted from pulsing the plate line 314 high. The sense amplifiers 324 are used to write-back a logical one to a memory cell from which a one was read.

As previously mentioned, a problem with memory cells employing ferroelectric capacitors is the imprinting effect that causes the hysteresis curve of the capacitors to shift. Embodiments of the present invention address the imprinting problem by occasionally changing the charge state of the capacitors of the memory cells to its opposite or complementary charge state in order to compensate for the shift in the curve. As previously explained, charge defects in the ferroelectric material of the capacitor tend to migrate to the interface of the ferroelectric material and one of the capacitor electrodes under the influence of a bias applied across the capacitor plates in storing and reading data. By occasionally applying a bias of an opposite polarity, which will change the charge state of the capacitor to its complementary charge state, the charge defects can be maintained within or drawn back toward the bulk of the ferroelectric material.

In operation, the charge state of the capacitors of the memory cells are changed to the respective complementary states through the use of the complement circuit 236. Control signals generated by the command decoder 206 initiate the operation to change the charge states by sequencing through the rows of memory cells, much like a refresh operation for volatile memory, as known in the art. Upon the read/write circuitry 230 sensing the charge states of a row of memory cells, the complement circuit 236 then inverts the state of each sense amplifier to write back the complementary charge state to the accessed memory cells. The process is repeated for each row of memory cells until the charge state all of the memory cells of the memory array 202 have been changed.

It should be noted that changing the charge state of the capacitors of the memory cells then requires that when data is read from the cells, the charge state of the capacitor is interpreted correctly. Similarly, when data is written to the cells, the input data is translated correctly to the appropriate charge state. For example, assume that a data "1" is written to a memory cell, and consequently, the cell is programmed to a first charge state. As should be the case, when the cell is read, the first charge state is sensed and the output data provided by the memory device is a "1" value. When the charge state of the cell is changed from the first charge state to a second complementary charge state to inhibit the imprinting problem, the second charge state will now need to be sensed and interpreted such that the output data should still be a "1." Similarly, when a "1" is written to the cell, the capacitor is now programmed to the second charge state. Embodiments of the present invention handle the aforementioned issue through the use of the register 232 and the logic circuitry 233 (FIG. 2). As briefly mentioned previously, the register 232 is used to store information indicative of the current data state of the memory cells of the array 202. The information is provided to the logic circuitry 233, which in turn provides the output data from the memory array 202 having the correct data value based on the charge state of a memory cell and the information stored by the register 232.

Figure 5A:
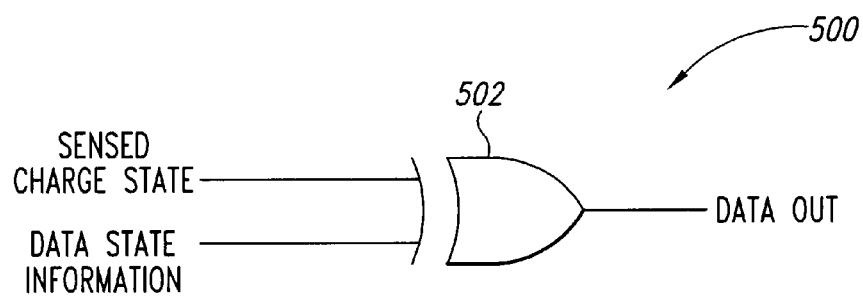
FIGS. 5A and 5B are schematic diagrams of a portion of the memory device of FIG. 2 according to embodiments of the present invention.

Illustrated in FIG. 5A is logic circuitry 500 that can be substituted for the logic circuitry 233 of FIG. 2. The logic circuitry 500 is represented by a two-input boolean exclusive OR (XOR) gate 502. It will be appreciated that implementation of an XOR function is well known in the art, and the details of the particular design of an appropriate XOR gate are such that they may be modified without departing from the scope of the present invention. Further included in the logic circuitry 500 is circuitry (not shown) to translate input data written to memory cells to the appropriate charge state based on the information stored by the register 232. Such circuitry is similar to that shown in FIG. 5A, and consequently, a detailed description directed to that particular circuitry will not be separately provided herein. The sensed charge state of an accessed memory cell is provided to a first input of the XOR gate 502 and the information stored in the register 232 is provided to a second input of the XOR gate 502.

The following description is provided by way of example to illustrate operation of embodiments of the present invention. Consequently, the particular details of the following example should not interpreted as limiting the scope of the present invention. As previously described, the register 232 stores information indicative of the data state of the memory array 202. In one embodiment, the information is represented by a flag that can be set to indicate that the memory array 202 is in a "not" data state, that is, the charge state of a memory cell sensed by a sense amplifier 324 needs to be inverted to provide the correct output data value. Conversely, when the flag is not set, the memory array 202 is in a "true" data state, and the sensed charge state of a memory cell does not need to be inverted to provide the correct output data value. Thus, as long as the flag is set accordingly, and is updated whenever the charge state of the memory cells is complemented, the output data value will be correct.

Figure 5B:
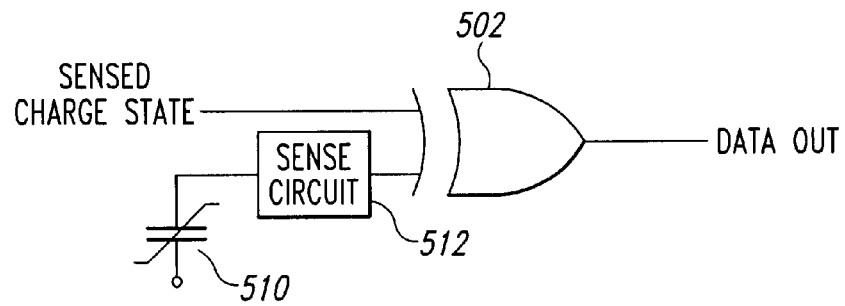

An alternative embodiment of the register 232 and logic circuitry 233 is illustrated in FIG. 5B. Rather than storing a flag in a register, the charge state of a dedicated ferroelectric capacitor 510 can be programmed to correspond to the data state of the memory array. The charge state of the dedicated ferroelectric capacitor 510 is sensed by a sensing circuit 512 having an output coupled to one of the input terminals of the XOR gate 502 and converts the sensed charge state to a data value that is provided to the XOR gate 502. For example, a first charge state is stored by the dedicated ferroelectric capacitor 510 to represent the "true" data state of the memory cells of the memory array. In the case of the XOR gate 502, the true data state is represented when the charge state of the dedicated capacitor 510 corresponds to a LOW logic level input to the XOR gate 502. As a result, the data value of the output data of the XOR gate 502 is then the same as the data value of the input data. When a second charge state, complementary to the first charge state, is stored by the dedicated ferroelectric capacitor 510, a "not" charge state of the memory cells of the memory array is represented. For the XOR gate 502, the second charge state will correspond to a HIGH logic level. The resulting data value of the output data from the XOR gate 502 is then the complement of the data value of the input data.

It will be appreciated that alternative register arrangements and logic circuitry can be used to provide output data having the correct data value. Such alternative arrangements can be designed by those of ordinary skill in the art. Thus, the description of the present invention provided herein is sufficient to enable one of such skill to practice the invention. It will be further appreciated that changing the charge state of the ferroelectric capacitors of the memory cells can be made periodically, similar to refresh operations typically associated with conventional dynamic random access memory. Alternatively, the charge state of the memory cells can be made when a shift in the hysteresis curve reaches a threshold. That is, after a shift of a sufficient magnitude is detected, the charge state of the memory cells of the array are changed to their complementary charge state. It will be appreciated that the frequency of changing the charge state of the memory cells to the complementary charge state is a detail that may be modified without departing from the scope of the present invention.

It will be further appreciated that the changing of the charge state of the memory cells of the memory array can be performed "automatically" by the device itself, similar to autorefresh operations for volatile memory devices, as known in the art. The operation could also be initiated based on externally provided commands applied to the memory device. Those of ordinary skill in the art have a sufficient understanding of the present invention as provided by the description provided herein to modify known memory circuitry to perform such operations.

From the foregoing it will be appreciated that, although specific embodiments of the invention have been described herein for purposes of illustration, various modifications may be made without deviating from the spirit and scope of the invention. For example, Accordingly, the invention is not limited except as by the appended claims.

What is claimed is:

1. In a memory device having an array of memory cells, a method for reducing imprinting of a memory cell comprising:
    storing charge in a memory cell of the array corresponding to a first state; and
    while the memory cell is not being accessed for a read or write operation, storing charge in the memory cell corresponding to a second state complementary to the first state.

2. The method of claim 1, further comprising restoring the charge in the memory cell corresponding to the first state.

3. The method of claim 1 wherein storing charge in a memory cell of the array corresponding to a first state and storing charge in the memory cell corresponding to a second state complementary to the first state are performed for each of the memory cells of the array in a sequence according to memory addresses of the memory cells.

4. The method of claim 3, further comprising storing the memory address of the memory cell next in the sequence.

5. The method of claim 1 wherein storing charge in a memory cell of the array corresponding to a first state and storing charge in the memory cell corresponding to a second state complementary to the first state are performed for each of the memory cells of the array, and the method further comprises storing an indicator indicative of whether the charge of the memory cells corresponds to an original state or a complemented state.

6. The method of claim 1 wherein storing charge in a memory cell of the array corresponding to a first state comprises applying a first bias to the memory cell and storing charge in the memory cell corresponding to a second state complementary to the first state comprises applying a second bias to the memory cell.

7. The method of claim 6 wherein the first and second biases are opposite in polarity.

8. The method of claim 1 wherein the memory cells include a capacitor having a dielectric formed from a ferroelectric material.

9. In a memory device having an array of memory cells, a method for reducing imprinting of a ferroelectric memory cell comprising:
    determining a charge state of at least one memory cell; and
    in response to determining the charge state, storing a complementary charge state in each of the memory cells for which the charge state was determined.

10. The method of claim 9 wherein determining and storing are performed periodically.

11. The method of claim 9 wherein determining and storing are performed for each of the memory cells of the array.

12. The method of claim 11, further comprising storing in a register a value indicative of whether the charge states of the memory cells correspond to the determined charge state or the complementary charge state.

13. The method of claim 11, further comprising storing a charge state to a dedicated capacitor indicative of whether the charge states of the memory cells correspond to the determined charge state or the complementary charge state.

14. The method of claim 9 wherein determining and storing are performed for each of the memory cells of the array and repeated periodically for all of the memory cells.

15. The method of claim 9 wherein determining comprises reading a charge state from the memory cell and storing comprises applying a bias to the memory cell to store a complementary charge state.

16. The method of claim 9 wherein the memory cells of the array each include a capacitor having a dielectric formed from a perovskite oxide.

17. A method for reducing imprinting of a ferroelectric memory cell, comprising:
    while the memory cell is not being accessed for a read or write operation, periodically applying a bias to the ferroelectric memory cell to place the ferroelectric memory cell into a complementary charge state.

18. The method of claim 17 wherein periodically applying a bias comprises applying a bias having a polarity opposite of a previously applied bias that placed the ferroelectric memory cell into an original charge state.

19. The method of claim 17, further comprising storing an indicator indicative of whether the memory cell is in the complementary charge state or an original charge state.

20. The method of claim 17, further comprising storing a charge state to a ferroelectric capacitor indicative of whether the memory cell is in the complementary charge state or an original charge state.

21. The method of claim 17 wherein periodically applying a bias to the ferroelectric memory cell includes determining an original charge state of the memory cell.

22. A method for reducing imprinting of an array of ferroelectric memory cells, comprising:
    while the memory cell is not being accessed for a read or write operation, periodically applying a bias to the ferroelectric memory cells of the array to place each ferroelectric memory cell into a complementary charge state.

23. The method of claim 22, further comprising storing an indicator indicative of whether the ferroelectric memory cells are in the complementary charge state or an original charge state.

24. The method of claim 23 wherein storing an indicator comprises storing a charge state to a ferroelectric capacitor, the charge state indicative of whether the ferroelectric memory cells are in the complementary charge state or an original charge state.

25. In a memory device having an array of memory cells, a method for reducing imprinting of the memory cells of the array comprising:

determining a charge state of a memory cell of the array; and in response to determining the charge state, writing data to the memory cell corresponding to a complementary charge state.

26. The method of claim 25 wherein determining the charge state of the memory cell comprises reading data stored by the memory cell.

27. The method of claim 25 wherein determining the charge state comprises:

applying a reading pulse to the memory cell;

comparing a voltage at provided by the memory cell in response to the read pulse and a predetermined voltage; and determining the charge state of the memory cell based on the voltage provided by the memory cell relative to the predetermined voltage.

28. The method of claim 25, further comprising storing a charge state to a dedicated capacitor indicative of whether the memory cell is in the complementary charge state or the determined charge state.

29. A method for reducing imprinting of a capacitor having a dielectric formed from a ferroelectric material, the method comprising:

while the memory cell is not being accessed for a read or write operation, applying a bias to the capacitor to change the charge state of the capacitor to a complementary charge state.

30. The method of claim 29 wherein applying a bias to the capacitor comprises applying a bias having a polarity opposite of a previously applied bias that placed the capacitor into an original charge state.

31. The method of claim 29, further comprising:

applying a read pulse to a first terminal of the capacitor;

comparing a voltage at a second node of the capacitor and a predetermined voltage; and determining the charge state of the capacitor based on the voltage of the second node relative to the predetermined voltage.

32. A memory device, comprising:

an array of memory cells;

read/write circuit coupled to the array of memory cells for reading data from and writing data to the memory cells;

complementary charge state circuitry coupled to the read/write circuit for sensing an original charge state of the memory cells and providing a complementary charge state to the read/write circuit to be written to the respective memory cells;

a register coupled to the complementary charge state circuitry and the read/write circuit to store an indicator of whether the charge state of the memory cells of the array are storing the original charge state or the complementary charge state; and a logic circuit coupled to the read/write circuit to provide output data from a memory cell based on the data of the memory cell and the indicator.

33. The memory device of claim 32 wherein the memory cells of the array comprise ferroelectric memory cells.

34. The memory device of claim 32 wherein the register comprises a ferroelectric memory cell storing a charge state corresponding to the charge state of the memory cells.

35. The memory device of claim 32 wherein the logic circuit comprises a boolean exclusive OR function.

36. A memory device having an array of ferroelectric memory cells, comprising:

read/write circuit coupled to the array of ferroelectric memory cells for reading data from and writing data to the ferroelectric memory cells;

complementary charge state circuitry coupled to the read/write circuit for sensing an original charge state of the ferroelectric memory cells and providing a complementary charge state to the read/write circuit to be written to the respective ferroelectric memory cells;

a dedicated ferroelectric capacitor coupled to the complementary charge state circuitry and the read/write circuit to store a charge state corresponding to whether the charge state of the memory cells of the array are storing the original charge state or the complementary charge state; and a logic circuit coupled to the read/write circuit and the dedicated ferroelectric capacitor to provide output data from a ferroelectric memory cell based on the data of the ferroelectric memory cell and the charge state of the dedicated ferroelectric capacitor.

37. The memory device of claim 36 wherein the logic circuit comprises a boolean exclusive OR function.

* * * * *